US006052032A

United States Patent [19]
Järvinen

[11] Patent Number: 6,052,032
[45] Date of Patent: Apr. 18, 2000

[54] RADIO FREQUENCY AMPLIFIERS

[75] Inventor: Esko Järvinen, Espoo, Finland

[73] Assignee: Nokia Mobile Phones, Ltd., Espoo, Finland

[21] Appl. No.: 09/265,273

[22] Filed: Mar. 9, 1999

[30] Foreign Application Priority Data

Mar. 13, 1998 [FI] Finland ................................. 980567

[51] Int. Cl.$^7$ .................................................. H03F 3/04
[52] U.S. Cl. ............................................. 330/289; 330/296
[58] Field of Search ............................... 330/279, 285, 330/289, 296

[56] References Cited

U.S. PATENT DOCUMENTS

| | | | |
|---|---|---|---|
| 5,099,204 | 3/1992 | Wheatley, III | 330/279 |
| 5,101,175 | 3/1992 | Vaisanen | 330/279 |
| 5,109,538 | 4/1992 | Ikonen et al. | 455/89 |
| 5,118,965 | 6/1992 | Vaisanen et al. | 307/261 |
| 5,152,004 | 9/1992 | Vaisanen et al. | 455/68 |
| 5,204,643 | 4/1993 | Varronen | 333/81 R |
| 5,214,372 | 5/1993 | Vaisanen et al. | 324/95 |
| 5,230,091 | 7/1993 | Vaisanen | 455/88 |
| 5,241,284 | 8/1993 | Nyqvist et al. | 330/297 |
| 5,241,694 | 8/1993 | Vaisanen et al. | 455/126 |
| 5,276,917 | 1/1994 | Vanhanen et al. | 455/89 |
| 5,291,147 | 3/1994 | Muurinen | 330/136 |
| 5,392,464 | 2/1995 | Pakonen | 455/115 |
| 5,404,585 | 4/1995 | Vimpari et al. | 455/115 |
| 5,432,473 | 7/1995 | Mattila et al. | 330/133 |
| 5,434,537 | 7/1995 | Kukkonen | 330/2 |
| 5,450,620 | 9/1995 | Vaisanen | 455/127 |
| 5,493,255 | 2/1996 | Murtojarvi | 330/296 |
| 5,497,125 | 3/1996 | Royds | 330/290 |
| 5,506,544 | 4/1996 | Staudinger et al. | 330/277 |
| 5,530,923 | 6/1996 | Heinonen et al. | 455/126 |
| 5,548,616 | 8/1996 | Mucke et al. | 375/295 |
| 5,564,074 | 10/1996 | Juntti | 455/67.1 |
| 5,675,611 | 10/1997 | Lehtinen et al. | 375/297 |
| 5,697,074 | 12/1997 | Makikallio et al. | 455/126 |
| 5,745,016 | 4/1998 | Salminen | 333/17.1 |
| 5,752,172 | 5/1998 | Matero | 455/127 |
| 5,801,587 | 9/1998 | Bray | 330/279 |
| 5,819,165 | 10/1998 | Hulkko et al. | 455/126 |
| 5,986,509 | 9/1998 | Lohninger | 330/290 |

FOREIGN PATENT DOCUMENTS 0 609 053 A3  8/1994  European Pat. Off. .
0 718 965 A1  6/1996  European Pat. Off. .

OTHER PUBLICATIONS

Patent Abstracts of Japan JP 581 78612.
Finnish Office Action.

*Primary Examiner*—Robert Pascal
*Assistant Examiner*—Henry Choe
*Attorney, Agent, or Firm*—Perman & Green, LLP

[57] ABSTRACT

A radio frequency amplifier having a power transistor (Q1) to the base of which is coupled a radio frequency signal to be amplified. An amplified radio frequency signal is provided at the collector of the power transistor (Q1). A control transistor (Qc) has its base coupled to the base of the power transistor (Q1) while a driver transistor (Q2) provides a control bias signal to the bases of the control and power transistors. A differential amplifier (Qd1, Qd2) has a first input coupled to an input bias signal and an output coupled to the base of the driver transistor (Q2). The collector of the control transistor (Qc) is coupled to a second input of the differential amplifier to provide a negative feedback signal to the differential amplifier and the driver transistor (Q2) and thereby to stabilise the operating point of the power transistor (Q1).

9 Claims, 2 Drawing Sheets

RADIO FREQUENCY AMPLIFIERS

FIELD OF THE INVENTION

The present invention relates to radio frequency amplifiers having a power transistor. In particular, though not necessarily, the invention relates to providing temperature compensation for the power transistor of a radio frequency amplifier.

BACKGROUND OF THE INVENTION

Power transistors are commonly used in many radio frequency (RF) devices and circuits including those incorporated into cellular radio telephones and cellular radio base station transceivers. Often, the stability of the output power is critical to the correct operation of the device or circuit, not only to ensure accurate RF output power levels but also to prevent damage to transistor itself. A common cause of output power instability is variation of the operating temperature of the power transistor, such as can arise due to self-heating and changes in the ambient temperature.

In order to ensure that a power transistor amplifies an RF signal with a desired gain, it is necessary to bias the transistor at a suitable "operating point". A simple biasing arrangement is shown in FIG. 1, where an RF signal RF_IN to be amplified is coupled to the input of a power transistor Q1. The amplified RF signal RF_OUT is obtained from the collector of the power transistor. A driver transistor Q2 is also coupled to the input of the power transistor Q1 to bias the power transistor at a suitable operating point. Temperature changes will however tend to change the base-emitter voltages of both the power and driver transistor, changing the operating point and therefore gain of the power transistor Q1. Provided that the emitter resistance Re is large, an increase in gain and collector current will tend to be offset by a decrease in the base-emitter voltage introducing a degree of stability to the transistor. However, a large emitter resistance results in a large power loss across that resistance, decreasing the efficiency of the amplifier.

FIG. 2 illustrates a modified power amplifier incorporating a typical temperature compensating biasing circuit. The circuit comprises a pair of diode-connected transistors Q3, Q4 connected between the base of the driver transistor Q2 and ground. The underlying operating theory is that the voltage drop across the two diode-connected transistors Q3, Q4 tracks that across the base-emitter junctions of the driver and power transistors Q1, Q2, maintaining the power transistor base current substantially constant and its operating point stable. As with the circuit of FIG. 1, additional stability is provided by the voltage drop across the emitter resistance Re although again this tends to reduce the efficiency of the amplifier.

Although the temperature compensation circuit of FIG. 2 is widely used, it is not ideal. Firstly, fluctuations in the bias voltage Vbias, usually generated from a regulated voltage (e.g. the supply voltage Vsup), have a significant effect on the collector current Ic of the power transistor Q1. Secondly, as the base-emitter regions of the two diode-connected transistors Q3, Q4 are not operating under exactly the same conditions as the power and driver transistors Q1, Q2 (for example they do not receive the RF input signal), the voltage drop across the former may not necessarily follow that across the base-emitter junctions of the latter, even if the operating temperatures of all four transistors are substantially identical. This problem is exacerbated by differences between the various transistors which arise from possibly wide manufacturing tolerances, even where the entire circuit is integrated onto a single semiconductor chip.

SUMMARY OF THE INVENTION

It is an object of the present invention to provide a radio frequency amplifier which overcomes or at least mitigates the above noted disadvantages. This and other objects are achieved by providing an additional control transistor arranged to conduct a current density substantially identical to that conducted by the power transistor of the amplifier, and to provide a feedback signal for controlling biasing of the power transistor.

According to a first aspect of the present invention there is provided a radio frequency amplifier comprising:

a power transistor having an input for receiving a radio frequency signal to be amplified and an output for providing an amplified radio frequency signal;

a control transistor having an input coupled to said input of the power transistor;

a driver transistor having an output coupled to said inputs of the power and control transistors for providing a control bias signal to the power and control transistors; and a differential amplifier having a first input coupled to an input signal and an output coupled to an input of the driver transistor for providing a driver control signal to the driver transistor, the control transistor having an output coupled to a second input of the differential amplifier, wherein the output of the control transistor tends to follow the output of the power transistor and provides a negative feedback signal to the differential amplifier.

Embodiments of the present invention provide a feedback signal from the output of the control transistor to the differential amplifier, which signal tends to drive the output of the differential amplifier, and therefore the power transistor control bias signal, to maintain the power amplifier at a substantially constant operating point. The present invention reduces the effect of temperature changes on the operating point of the power amplifier.

Preferably, the feedback loop provided by the control transistor and the differential amplifier further comprises low pass filter means arranged to remove the effect of radio frequency variations occurring at said output of the control transistor.

The power transistor may have any suitable configuration. However, a preferred configuration consists of two or more transistor elements coupled in parallel.

Preferably, the power transistor and the control transistors are configured such that in the active state the current densities flowing through the transistors are substantially identical. More preferably, both the power and control transistors are provided with respective base and emitter resistances, where the values of the resistances are inversely proportional to the active area of the respective transistors.

Preferably, the differential amplifier of the present invention is an emitter coupled differential amplifier.

Preferably, a stabilising capacitance is provided between the input of the driver transistor and said second input of the differential amplifier.

Embodiments of the present invention may comprise a gain control signal coupled to said output of the control transistor and to said second input of the differential amplifier. The gain control signal may be used to vary the driver control signal applied to the driver transistor and therefore the control bias signal applied to the power transistor, thereby varying the operating point of the power transistor.

According to a second aspect of the present invention there is provided a method of stabilising the operating point of a radio frequency power transistor which receives an RF signal to be amplified at an input thereof and which provides an amplified RF signal at an output thereof, the method comprising:

coupling a control bias signal to said input of the power transistor and to an input of a control transistor;

generating a difference signal which is substantially proportional to the difference between an output signal of the control transistor and an input signal; and coupling said difference signal to an input of a driver transistor, said control bias signal being an output signal of the driver transistor.

BRIEF DESCRIPTION OF THE DRAWINGS

For a better understanding of the present invention and in order to show how the same may be carried into effect reference will now be made, by way of example, to the accompanying drawings, in which.

DETAILED DESCRIPTION

Figure 1:
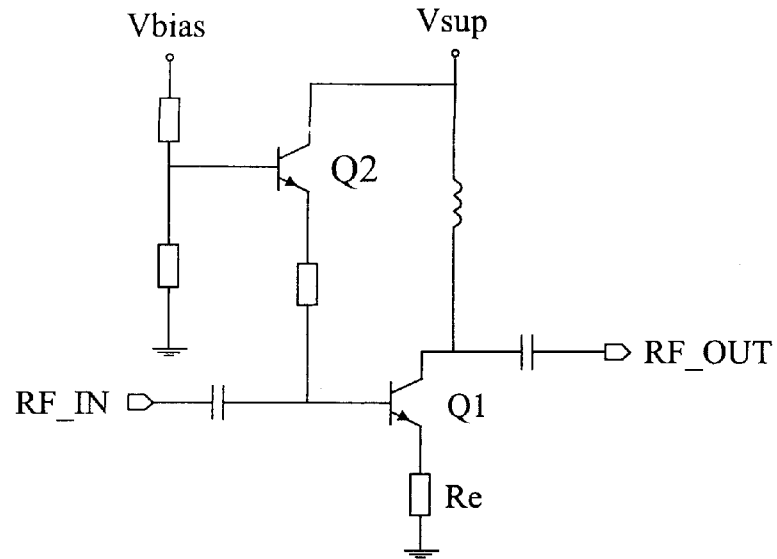
FIG. 1 shows a radio frequency amplifier without temperature compensation.

A simple RF amplifier and a known temperature compensation circuit have been described above with reference to FIGS. 1 and 2. FIG. 3 illustrates an improved temperature compensation circuit for an RF amplifier comprising a power transistor Q1 and a driver transistor Q2. Whilst the driver transistor Q2 is provided by a single n-p-n bipolar junction transistor, the power transistor is provided by a set (m in number where m may be, for example, 48) of n-p-n bipolar junction transistors (or transistor elements) with respective emitter and base resistances and RF input coupling capacitances, connected in parallel. This is illustrated in the inset A in FIG. 3.

The temperature compensation circuit of FIG. 3 comprises a control transistor Qc. The control transistor is provided by a single n-p-n bipolar junction transistor element substantially identical to one of the transistor elements making up the power transistor Q1. As such, the active area of the control transistor Qc is 1/m times the effective active area of the power transistor Q1. The control transistor Qc is provided with a base resistance Rb and an emitter resistance Re whilst the power transistor Q1 is provided with a base resistance Rb/m and an emitter resistance of Re/m. The collector of the control transistor Qc is connected to a regulated dc voltage Vreg via a collector resistance R1.

The collector of the control transistor Qc is also connected to the positive input of a differential amplifier. The differential amplifier comprises a pair of emitter coupled bipolar junction transistors Qd1, Qd2, having their collectors coupled to the regulated voltage Vreg via respective collector resistances, and is arranged to provide an output voltage Vo at the collector of the transistor Qd1:

Vo=A(V2−V1)

where V1 and V2 are the base voltages present on the transistors Qd1 and Qd2 respectively and A is the gain of the differential amplifier. V1 is generated from the regulated voltage Vreg via a resistance divider network.

The output voltage Vo of the differential amplifier is coupled via a stabilising resistance R2 to the base of the driver transistor Q2 which has its collector coupled to the supply voltage Vsup. The base of the driver transistor is also coupled to the base of the transistor Qd2 via a stabilising capacitance C1. The driver transistor Q2 is connected to the bases of the power and control transistors Q1, Qc via the respective base resistances to provide a biasing signal to both transistors.

Due to the relative scaling of the active area, base resistance, and emitter resistance of the power transistor Q1 and the control transistor Qc, the base-emitter and collector-emitter current densities flowing through both transistors will be substantially the same. Changes in the collector current of the power transistor Q1, due for example to heating effects, can therefore be expected to be reflected in the collector current of the control transistor Qc, scaled down by a factor of m.

Consider for example that the temperature of the power transistor Q1 rises after some period of operation, causing the collector current and therefore the RF gain of the transistor to increase, deviating from the desired operating point. The collector current of the control transistor Qc will increase proportionally, causing the transistor's collector voltage to decrease (due to the increase in the voltage drop across the collector resistance R1). As this collector voltage provides the input voltage V2 for the differential amplifier, the output voltage Vo of the differential amplifier will fall. The base current applied to the driver transistor Q2 then falls, decreasing the bias currents applied to the power and control transistors and reducing the gain of these transistors.

The control transistor and the differential amplifier therefore have the effect of providing a negative feedback control signal to the driver transistor Q2 which tends to counteract changes in the properties of the power transistor Q1 which would otherwise cause the gain of the power transistor to fluctuate. The various passive components of the circuit are selected to ensure the correct operation of the circuit. In particular, the stabilising resistance R2 and C1 are selected and arranged to stabilise the performance of the feedback loop and in particular to remove the effects of high frequency variations occurring at the collector of the control transistor Qc whilst still enabling the circuit to respond quickly to output changes. Components can be selected using, for example, computer simulations.

Figure 2:
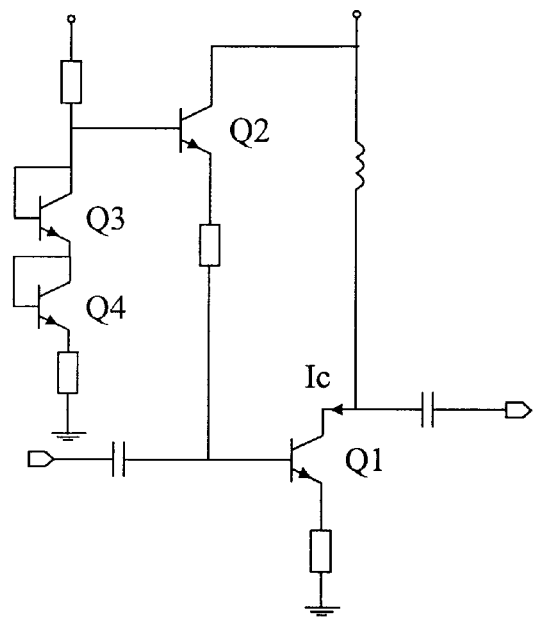
FIG. 2 shows the radio frequency amplifier of FIG. 1 with a prior art temperature compensation circuit.
Figure 3:
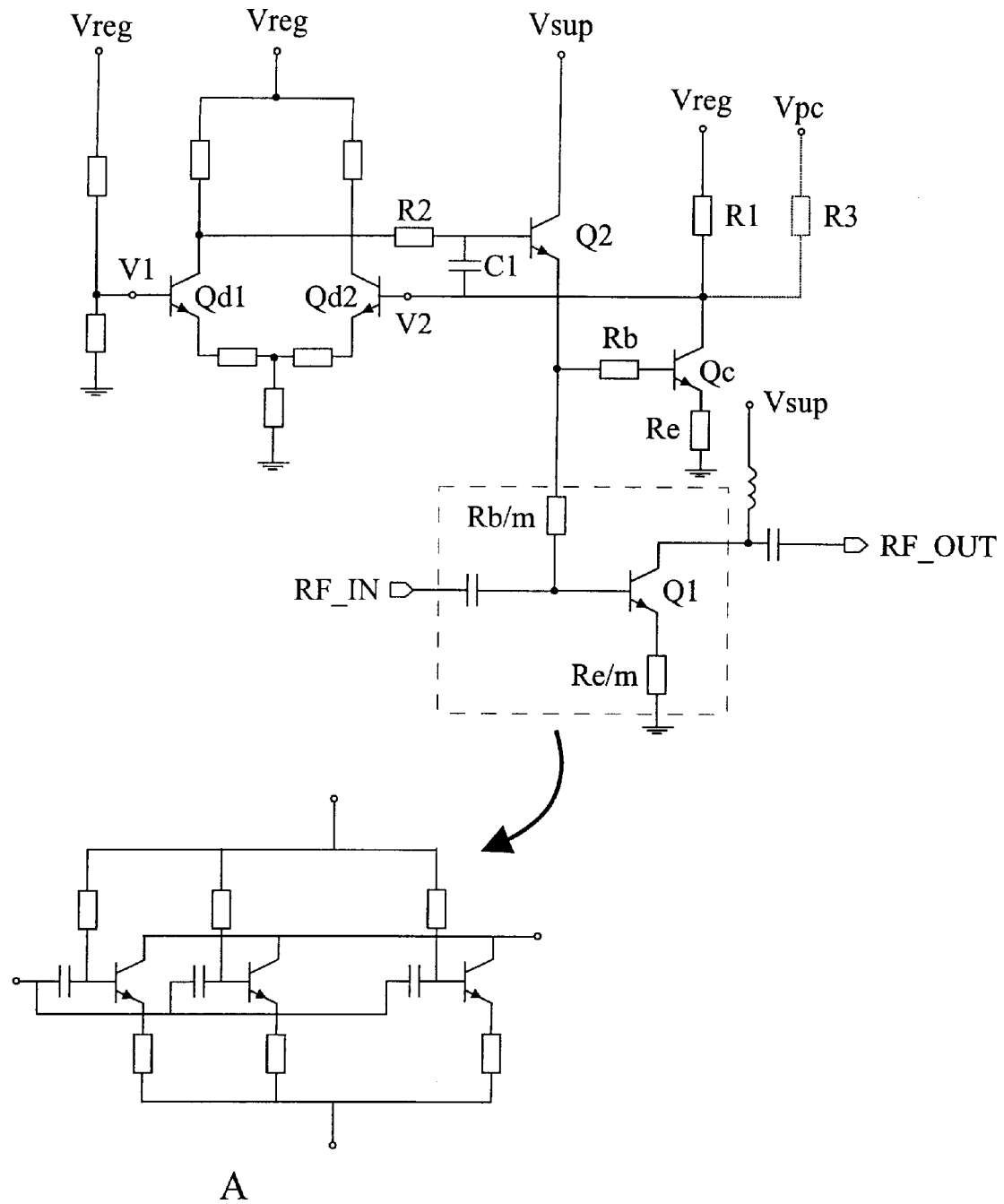
FIG. 3 shows a radio frequency amplifier of FIG. 2 with a temperature compensation circuit according to an embodiment of the present invention.

An important and surprising advantage of the circuit of FIG. 3 is that the emitter resistance (Re/m) associated with the power transistor Q1 can be small relative to known circuits such as are illustrated in FIGS. 1 and 2, indeed the resistance of bond wires connecting the emitters of the power transistor elements to ground, or even parasitic resistances, may be sufficient (to avoid current "hogging"). This is because a large temperature compensating emitter resistance is no longer required. The circuit of FIG. 3 results in a reduced power loss across the emitter resistance and an improvement in the efficiency of the amplifier.

FIG. 3 also illustrates an optional gain control input in which a gain control voltage Vpc is applied to the collector of the control transistor Qc via a resistance R3. The voltage Vpc will tend to increase the input voltage V2 to the differential amplifier, in turn increasing the bias current provided by the driver transistor Q2. This will increase the RF gain of the power transistor Q1.

The circuit of FIG. 3 may be implemented with discrete components, but is preferably integrated into a single semiconductor chip. This has the advantage that the operating temperature of the various components, and in particular of the control and power transistors, will tend to be equalised. A preferred configuration involves arranging the transistor elements of the power transistor according to the "common centroid" geometry, and arranging the control transistor directly adjacent, or amongst, the transistor elements of the power transistor.

It will be appreciated by the skilled person that various modifications may be made to the above described embodiment without departing from the scope of the present invention. For example, the present invention may be applied to stabilise the properties of power field effect transistor (FET) such as a metal oxide semiconductor FET (MOSFET) or a metal semiconductor FET (MESFET), comprising a set of FET elements connected in parallel. Stabilisation is achieved using a gain control FET which forms part of a negative feedback loop. The configuration and arrangement of the control FET are such that the drain-source current density is substantially identical to that in the power FET.

What is claimed is:

1. A radio frequency amplifier comprising:
    a power transistor having an input for receiving a radio frequency signal to be amplified and an output for providing an amplified radio frequency signal;
    a control transistor having an input coupled to said input of the power transistor;
    a driver transistor having an output coupled to said inputs of the power and control transistors for providing a control bias signal to the power and control transistors; and
    a differential amplifier having a first input coupled to an input signal and an output coupled to an input of the driver transistor for providing a driver control signal to the driver transistor,
    the control transistor having an output coupled to a second input of the differential amplifier, wherein the output of the control transistor tends to follow the output of the power transistor and provides a negative feedback signal to the differential amplifier.

2. A radio frequency amplifier according to claim 1, comprising low pass filter means arranged to remove the effect of radio frequency variations occurring at said output of the control transistor from said negative feedback signal.

3. A radio frequency amplifier according to claim 1, wherein the power transistor consists of two or more transistor elements coupled in parallel.

4. A radio frequency amplifier according to claim 1, wherein the power transistor and the control transistor are configured such that in the active state the current densities flowing through the transistors are substantially identical.

5. A radio frequency amplifier according to claim 1, wherein both the power and control transistors are provided with respective base and emitter resistances, the values of the resistances being inversely proportional to the active area of the respective transistors.

6. A radio frequency amplifier according to claim 1, wherein the differential amplifier is an emitter coupled differential amplifier.

7. A radio frequency amplifier according to claim 1, wherein a stabilising capacitance is provided between the input of the driver transistor and said second input of the differential amplifier.

8. A radio frequency amplifier according to claim 1, wherein a gain control signal is coupled to said output of the control transistor and to said second input of the differential amplifier.

9. A method of stabilizing the operating point of a radio frequency power transistor which receives an RF signal to be amplified at an input thereof and which provides an amplified RF signal at an output thereof, the method comprising:
    coupling a control bias signal to said input of the power transistor and to an input of a control transistor;
    generating a difference signal which is substantially proportional to the difference between an output signal of the control transistor and an input signal; and
    coupling said difference signal to an input of a driver transistor, said control bias signal being an output signal of the driver transistor.

* * * * *